(12) United States Patent
Mizumura

(10) Patent No.: US 10,818,492 B2
(45) Date of Patent: Oct. 27, 2020

(54) METHOD FOR MANUFACTURING THIN FILM TRANSISTOR AND MASK FOR USE IN THE MANUFACTURING METHOD

(71) Applicant: V TECHNOLOGY CO., LTD., Yokohama-shi (JP)

(72) Inventor: Michinobu Mizumura, Yokohama (JP)

(73) Assignee: V TECHNOLOGY CO., LTD., Yokohama-shi (JP)

( * ) Notice: Subject to any disclaimer, the term of this patent is extended or adjusted under 35 U.S.C. 154(b) by 0 days.

(21) Appl. No.: 16/115,494

(22) Filed: Aug. 28, 2018

(65) Prior Publication Data
US 2019/0035629 A1    Jan. 31, 2019

Related U.S. Application Data

(63) Continuation of application No. PCT/JP2017/004985, filed on Feb. 10, 2017.

(30) Foreign Application Priority Data

Mar. 16, 2016    (JP) .................. 2016-052087

(51) Int. Cl.
*H01L 21/02*    (2006.01)
*H01L 27/12*    (2006.01)
(Continued)

(52) U.S. Cl.
CPC ...... *H01L 21/02678* (2013.01); *G03F 7/0043* (2013.01); *G03F 7/201* (2013.01);
(Continued)

(58) Field of Classification Search
None
See application file for complete search history.

(56) References Cited

U.S. PATENT DOCUMENTS 6,731,446 B2 * 5/2004 Ikeda ................ G11B 5/59633
360/59
6,816,330 B2 * 11/2004 Ikeda .................... B82Y 10/00
360/55
(Continued)

FOREIGN PATENT DOCUMENTS

JP    2000-077353 A    3/2000
JP    2002-289524 A    10/2002
(Continued)

OTHER PUBLICATIONS

Japanese Office Action from Japanese Patent Application No. 2016-052087, dated Sep. 3, 2019, 7 pages including partial English language translation.
(Continued)

*Primary Examiner* — Michelle Mandala
(74) *Attorney, Agent, or Firm* — Morgan, Lewis & Bockius LLP

(57) ABSTRACT

The present invention provides a method for manufacturing a thin film transistor including processing of irradiating an amorphous silicon film 8 deposited on a substrate with laser light. The method comprises: a laser annealing step for forming a polysilicon film 9 including a channel region 52 by irradiating an area including a formation region of the region 52 in the film 8 with the laser light such that the area including the formation region is heated, melted, and recrystallized; and a removing step for etching off an area outside the region 52 from the polysilicon film 9. Thus, the present invention can provide a method for manufacturing a thin film transistor and a mask for use in the manufacturing method that are capable of promoting the recrystallization of the film 8 and thereby improving its electron mobility even when laser irradiation has to be performed under restricted irradiation conditions.

2 Claims, 9 Drawing Sheets

(51) Int. Cl.
*G03F 7/36* (2006.01)
*G03F 7/004* (2006.01)
*G03F 7/20* (2006.01)
*H01L 29/66* (2006.01)
*H01L 29/786* (2006.01)
*G02F 1/1368* (2006.01)
*G02F 1/1362* (2006.01)

(52) U.S. Cl.
CPC ............ *G03F 7/36* (2013.01); *H01L 21/0268* (2013.01); *H01L 21/02532* (2013.01); *H01L 21/02592* (2013.01); *H01L 27/1222* (2013.01); *H01L 27/1274* (2013.01); *H01L 27/1285* (2013.01); *H01L 27/1288* (2013.01); *H01L 29/66765* (2013.01); *H01L 29/78678* (2013.01); *G02F 1/1368* (2013.01); *G02F 2001/13625* (2013.01)

(56) References Cited

U.S. PATENT DOCUMENTS

2002/0094008 A1    7/2002    Tanaka
2003/0228723 A1    12/2003    Yamazaki et al.

FOREIGN PATENT DOCUMENTS

| | | |
|---|---|---|
| JP | 2003-243304 A | 8/2003 |
| JP | 2011-192771 A | 9/2011 |
| JP | 2013-157549 A | 8/2013 |
| WO | WO-2009/081775 A1 | 5/2011 |

OTHER PUBLICATIONS

International Preliminary Report on Patentability from PCT/JP2017/004985, dated Sep. 27, 2018, 16 pages, including translation.

\* cited by examiner

METHOD FOR MANUFACTURING THIN FILM TRANSISTOR AND MASK FOR USE IN THE MANUFACTURING METHOD

This application is a continuation application of PCT/JP2017/004985, filed on Feb. 10, 2017.

BACKGROUND OF THE INVENTION

Field of the Invention

The present invention relates to a method for manufacturing a thin film transistor, and specifically relates to a method for manufacturing a thin film transistor that is capable of improving the electron mobility in its channel region.

Description of Related Art

Laser annealing is performed in manufacturing a thin film transistor (referred to as "TFT" below). In an example of the laser annealing, the amorphous silicon film deposited on the substrate is irradiated with laser light so that the amorphous silicon film is heated, melted, and recrystallized (see WO 2009/081775, for example). It is known that such processing turns the amorphous silicon film into a polysilicon film, which has higher electron mobility than the amorphous silicon film. WO 2009/081775 discloses performing such laser annealing by locally irradiating a portion, to be made into the channel region between the source and drain electrodes, of the amorphous silicon film with laser light in order to improve the electron mobility in the channel region.

Regarding the relationship between the laser power (energy density [$mJ/cm^2$]) and the electron mobility (field-effect mobility) between the electrodes, the following has been known, for example. The electron mobility increases as the laser power increases until the electron mobility reaches its peak at a predetermined value of the laser power. However, when the amorphous silicon film is irradiated with laser light having a power higher than this predetermined value, the electron mobility in the amorphous silicon film will be reduced. This predetermined value of the laser power corresponding to the peak electron mobility varies depending on preset irradiation conditions of the laser light (such as the wavelength of the laser light, the number of pulsed irradiations, and/or other parameters). Such a reduction in electron mobility is attributed, for example, to damage of the amorphous silicon film which is caused when the amorphous silicon film is irradiated with laser light having a power higher than the value corresponding to the peak value of the electron mobility. Thus, in such conventional laser annealing, it is not preferable to irradiate the amorphous silicon film with laser light having a power higher than that corresponding to the peak value of the electron mobility, from the viewpoint of promoting the recrystallization of the amorphous silicon film and thereby improving its electron mobility. Therefore, the conventional laser annealing has a problem that laser irradiation has to be performed under irradiation conditions restricted based on the relationship between the laser power and the electron mobility.

SUMMARY OF THE INVENTION

To address the problems as described above, an object of the present invention is to provide a method for manufacturing a TFT and a mask for use in the manufacturing method that are capable of promoting the recrystallization of an amorphous silicon film and thereby improving its electron mobility even when laser irradiation has to be performed under restricted irradiation conditions.

To achieve the above object, according to the present invention, a method for manufacturing a TFT including processing of irradiating an amorphous silicon film deposited on a substrate with laser light comprises: a laser annealing step for forming a polysilicon film including a channel region by irradiating an area including a formation region of the channel region in the amorphous silicon film with the laser light such that the area including the formation region is heated, melted, and recrystallized; and a removing step for etching off an area outside the channel region from the polysilicon film.

A mask for use in a method for manufacturing a TFT according to the present invention has mask patterns arranged in a matrix at a constant arrangement pitch. The mask is used for projecting reduced-size images of the mask patterns through a projection lens and thereby irradiating areas corresponding to the mask patterns with laser light. Each of the mask patterns is a combination of a first pattern and a second pattern which are used for irradiating a to-be-irradiated object in which a gate electrode, an insulating film, and an amorphous silicon film are sequentially stacked. Specifically, through the first pattern, a formation region of a channel region in the amorphous silicon film is irradiated with the laser light. Through the second pattern, a storage region in the amorphous silicon film is irradiated with the laser light, the storage region storing heat generated by irradiation of the laser light.

In the method for manufacturing a TFT according to the present invention, the area including the formation region of the channel region is irradiated with the laser light. Thus, even when the irradiation of the laser light has to be performed under restricted irradiation conditions, an additional heat capacity, which is provided corresponding to the additional irradiated area size, helps maintain the temperature of the formation region. This promotes the recrystallization of the channel region and further improves the electron mobility in the channel region. Furthermore, etching off the area outside the channel region from the polysilicon film eliminates the need to take into account how the polysilicon film left in the area outside the channel region would affect the characteristics of the TFT.

The mask according to the present invention can be used in the method for manufacturing a TFT, and is capable of improving the electron mobility in the channel region.

DESCRIPTION OF PREFERRED EMBODIMENTS

Figure 1:
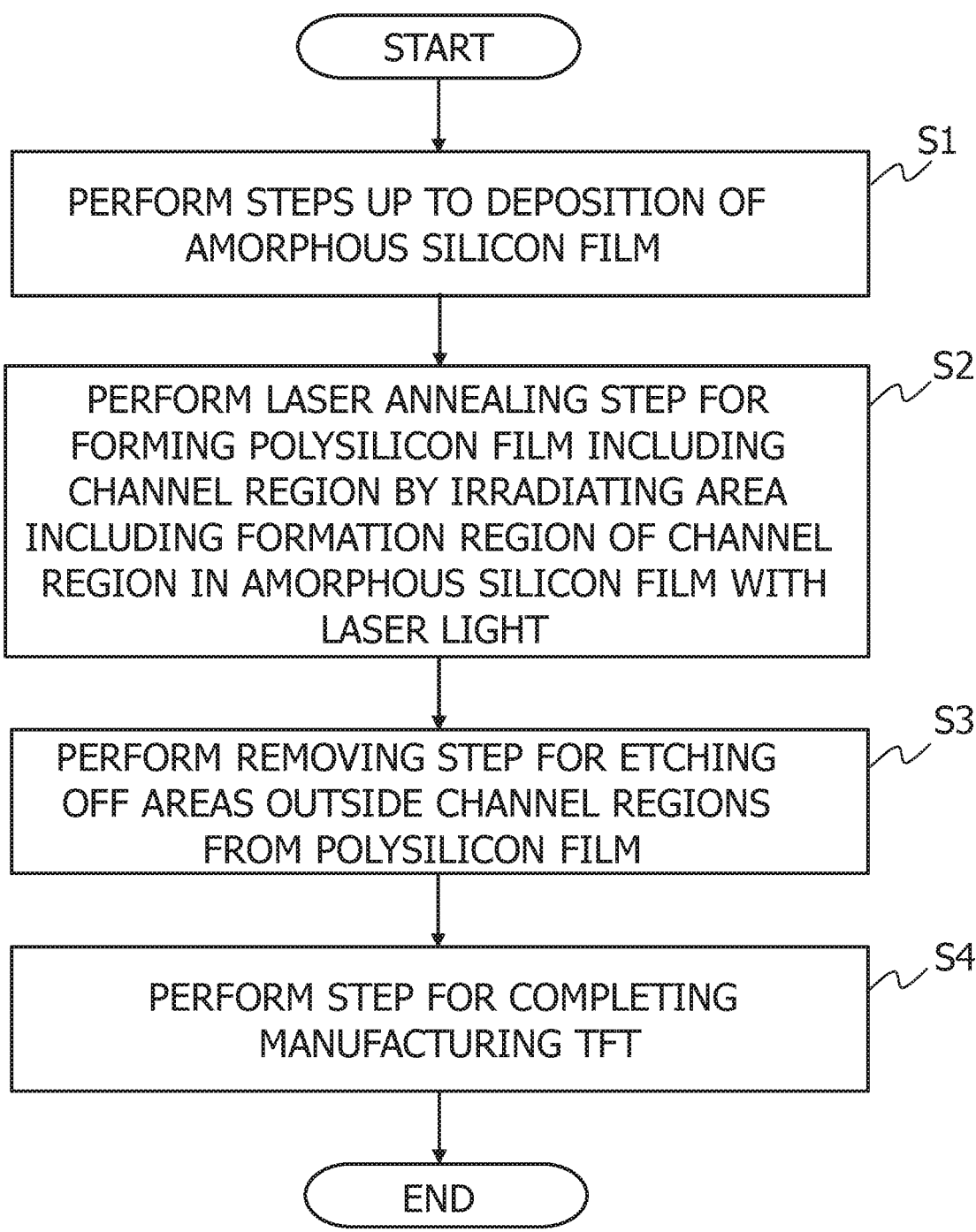
FIG. 1 is a flowchart for illustrating a first embodiment of a method for manufacturing a TFT according to the present invention.

Below, an embodiment of the present invention will be described in detail with reference to the accompanying drawings. FIG. 1 is a flowchart for illustrating a first embodiment of a method for manufacturing a TFT according to the present invention. The TFT is used in a liquid crystal display device, for example. To facilitate understanding of the technical features of the present invention, the method for manufacturing a TFT according to the first embodiment will be roughly divided into four steps in the following description.

Step S1, which is represented by one block, includes a plurality of steps up to the deposition of an amorphous silicon film in the method for manufacturing a TFT. Specifically, step S1 includes, for example, the steps of sequentially stacking a gate electrode, an insulating film, and an amorphous silicon film on a substrate by appropriately using a known technique.

Step S2 is a laser annealing step for forming a polysilicon film including a channel region by irradiating an area including a formation region of a channel region in the amorphous silicon film with laser light such that the area including the formation region is heated, melted, and recrystallized. Here, the formation region and a storage region which stores heat when the amorphous silicon film is heated and melted constitute the area including the formation region of the channel region. When the storage region is irradiated with laser light, heat is likely to be stored in layers under the amorphous silicon film that is stacked on the insulating film in the irradiated region. Obviously, the formation region, which is simultaneously irradiated with the laser light, also stores heat.

Step S3 is a removing step for etching off areas outside the channel regions from the polysilicon film formed in the laser annealing step of step S2.

Step S4, which is represented by one block, includes a plurality of steps up to the completion of manufacturing the TFT by appropriately using a known technique.

Figure 2:
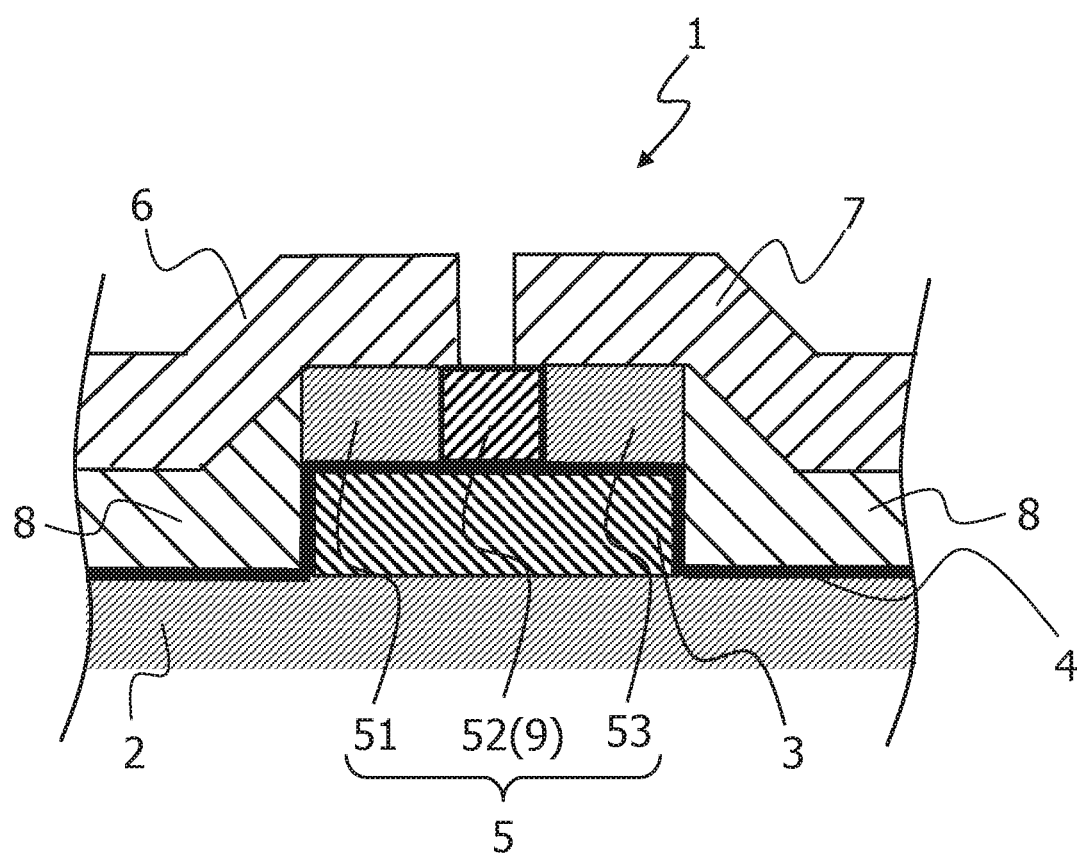
FIG. 2 is a cross-sectional view of an embodiment of a TFT manufactured by the method for manufacturing a TFT shown in FIG. 1.

FIG. 2 is a cross-sectional view of an embodiment of a TFT manufactured by the method for manufacturing a TFT shown in FIG. 1. In the TFT 1 shown in FIG. 2, a gate electrode 3, an insulating film 4, and a semiconductor layer 5 are stacked in this order on a substrate 2, and a source electrode 6 and a drain electrode 7 are formed with the semiconductor layer 5 interposed therebetween.

The gate electrode 3 is one of a plurality of gate electrodes 3 that are formed in a matrix at a constant arrangement pitch on the substrate 2 which is made of transparent glass, for example. The gate electrode 3 is electrically connected to a gate line 3a (see FIG. 6) formed on the substrate 2. The gate electrode 3 receives scan information from a gate driving circuit (not shown) for selectively driving the switching elements in the liquid crystal panel.

The insulating film 4, which is, for example, a gate insulating film for preventing or reducing a leakage current, is applied so as to cover the gate electrode 3. Note that the insulating film 4 is not particularly limited as long as it prevents or reduces a leakage current.

The semiconductor layer 5 includes an amorphous silicon film 8 and a polysilicon film 9. Specifically, the semiconductor layer 5 includes a source region 51, a channel region 52, and a drain region 53. The channel region 52 is provided on the gate electrode 3 with the insulating film 4 interposed therebetween at the position corresponding to a center portion of the gate electrode 3. The source and drain regions 51, 53 are each formed of a thin film of amorphous silicon semiconductor layer. The channel region 52 is formed of a thin film of polysilicon semiconductor layer. In FIG. 2, the polysilicon film 9 corresponds to the channel region 52.

Figure 6:
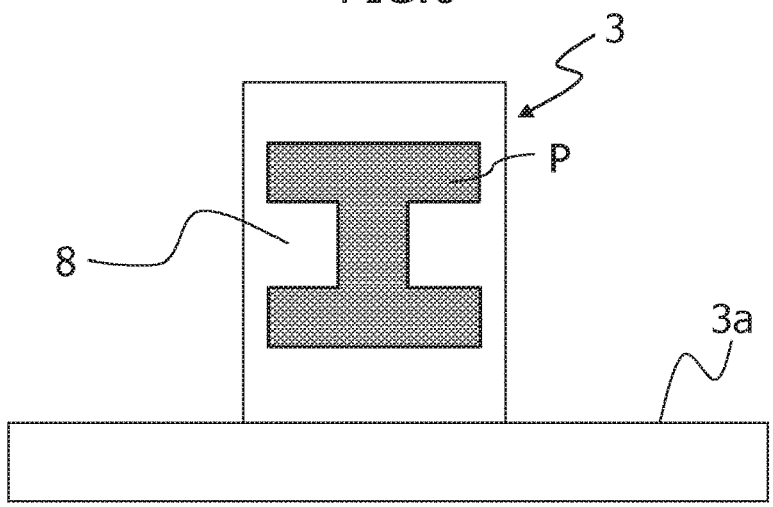
FIG. 6 is a plan view for illustrating an example laser annealing step according to the present invention.

The source electrode 6 is electrically connected to a data line (not shown), which is provided orthogonal to the gate line 3a (see FIG. 6). The source electrode 6 receives a signal from a source driving circuit (not shown) for providing signals to the pixel electrodes in the liquid crystal panel.

The drain electrode 7 provides a signal received through the data line and the source electrode 6 to a corresponding one of the pixel electrodes in the liquid crystal panel. The drain electrode 7 is electrically connected to the pixel electrode. The source electrode 6 and drain electrode 7 are connected to each other via the channel region 52. A protective film (not shown) is deposited on each of the source and drain electrodes 6, 7.

Figure 3:
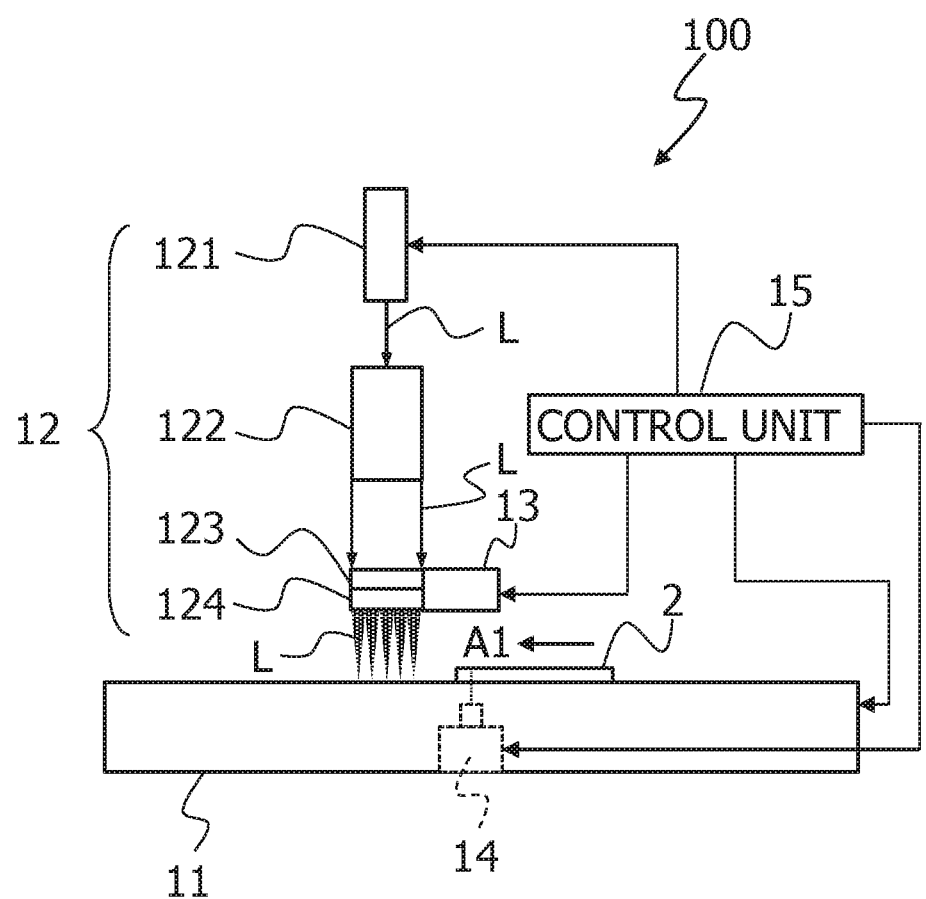
FIG. 3 is a schematic diagram of an example laser annealing apparatus used in the method for manufacturing a TFT according to the present invention.

Next, the laser annealing step (step S2 in FIG. 1), which characterizes the first embodiment, will be described below. FIG. 3 is a schematic diagram of an example laser annealing apparatus used in the method for manufacturing a TFT according to the present invention.

In the laser annealing step (step S2), a laser annealing apparatus 100 shown in FIG. 3 is used to irradiate the amorphous silicon film 8 (non-crystalline silicon film), which is deposited on the substrate 2, with laser light such that the amorphous silicon film 8 is heated, melted, and recrystallized into the polysilicon film 9 (polycrystalline silicon film). More specifically, the laser annealing apparatus 100 irradiates the areas each including the formation region of the channel region 52 in the amorphous silicon film 8 on the substrate 2, and thereby forms the polysilicon film 9 including the channel regions 52. Below, an example configuration of the laser annealing apparatus 100 will be described in detail.

An example configuration of the laser annealing apparatus 100 includes a transport means 11, a laser illumination optical system 12, an alignment means 13, an image capture means 14, and a control unit 15. The substrate 2, which is an example of a substrate to which the first embodiment is applied, includes the gate electrodes 3 (see FIG. 6) at the intersections (not shown) of the data lines and the gate lines 3a (see FIG. 6) which orthogonally intersect with the data lines.

The transport means 11 transports the substrate 2 provided with the amorphous silicon film 8 as its uppermost layer, in a predetermined direction. For example, the transport means 11 allows the substrate 2 to be positioned and placed thereon such that the transport direction (indicated by arrow A1) and the gate lines 3a are parallel.

Above the transport means 11, the laser illumination optical system 12 is disposed. The laser illumination optical system 12 irradiates the amorphous silicon film 8 on the substrate 2 with laser light L.

For example, the laser illumination optical system 12 includes a laser 121 as well as a coupling optical system 122, a light-shielding mask 123, and a microlens array 124 which are arranged in this order in the travel direction of the laser light L emitted by the laser 121. The laser 121, which emits a pulsed ultraviolet laser light L, may be an yttrium aluminum garnet (YAG) laser operating at a wavelength of 355 nm, for example. Note, however, that the laser 121 is not limited to a YAG laser, and may be another pulse laser such as an excimer laser operating at a wavelength of 308 nm.

The coupling optical system 122 expands the laser light L emitted by the laser 121 to achieve uniform illumination on the light-shielding mask 123. For example, the coupling optical system 122 may include optical instruments such as a beam expander, a photo integrator, and a collimator lens, which are not shown.

The light-shielding mask 123, which is an example of a mask according to the present invention, has mask patterns of openings of the same shape arranged in a matrix at a constant arrangement pitch. The light-shielding mask 123 is used for projecting reduced-size images of the mask patterns through microlenses 125 (see FIG. 5) that are provided to the laser illumination optical system 12 and thereby irradiating areas corresponding to the mask patterns with the laser light L. In the first embodiment, the mask patterns as described above is used, and this allows for extensive irradiation to a plurality of areas each including the formation region of the channel region 52 only with a single shot of the laser light L. This will be described in more detail later with reference to FIGS. 4 and 5.

The transport means 11 transports the substrate 2 on which the gate electrode 3, the insulating film 4, and the amorphous silicon film 8 have been sequentially stacked, in the predetermined direction (indicated by arrow A1 in FIG. 3). The laser illumination optical system 12 uses the light-shielding mask 123 to irradiate selective areas with the laser light L through the microlenses 125. In this embodiment, a plurality of TFTs 1 each shown in FIG. 2, for example, are manufactured on the substrate 2 by using the light-shielding mask 123.

Figure 4:
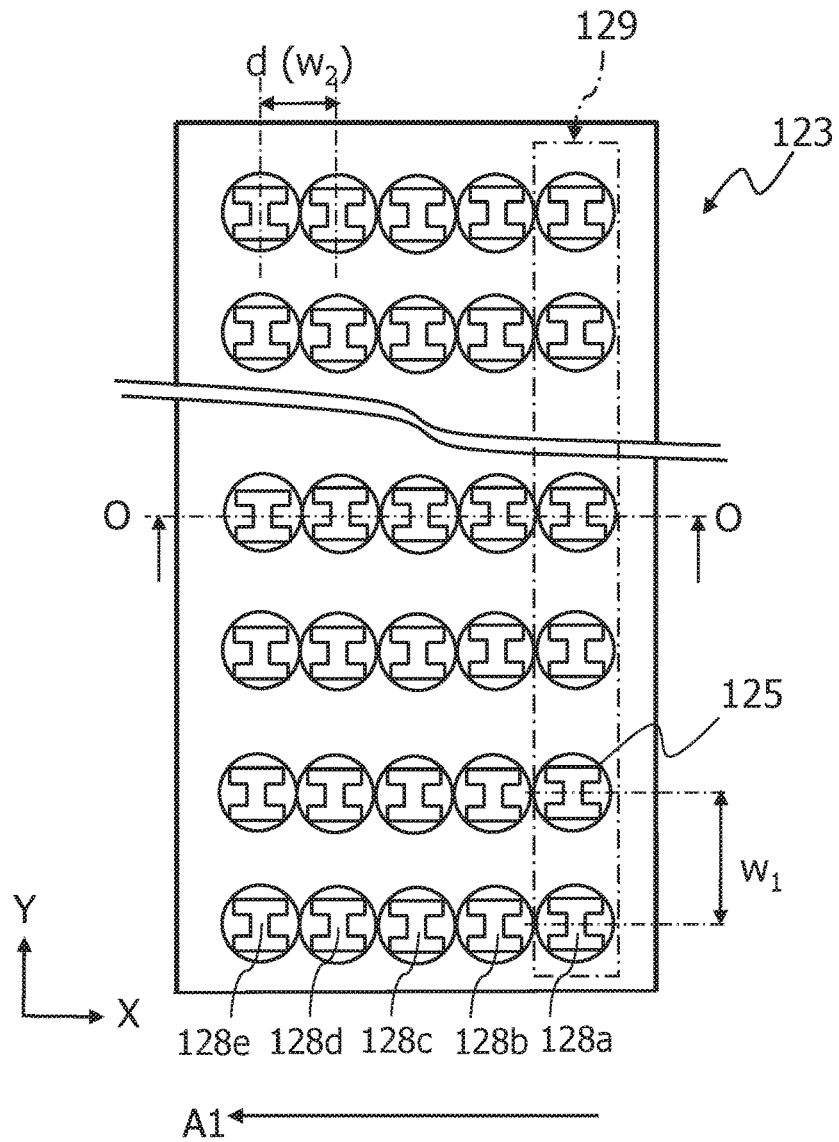
FIG. 4 is a plan view of an example configuration of a light-shielding mask and a microlens array used in the method for manufacturing a TFT according to the present invention.
Figure 5:
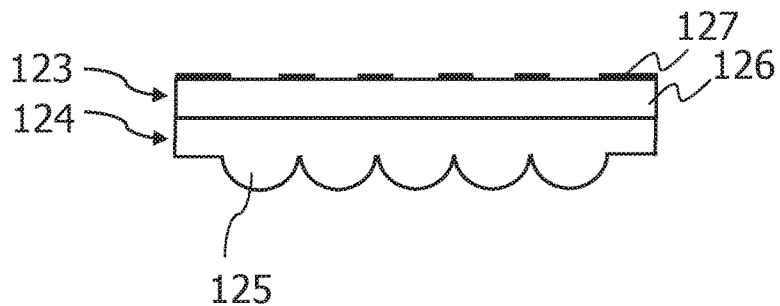
FIG. 5 is a cross-sectional view taken along line O-O of FIG. 4.

FIG. 4 is a plan view of an example configuration of the light-shielding mask and microlens array used in the method for manufacturing a TFT according to the present invention. FIG. 5 is a cross-sectional view taken along line O-O of FIG. 4. The light-shielding mask 123 includes a transparent quartz substrate 126 and a light-shielding film 127. The light-shielding film 127 is formed by depositing a material such as chromium (Cr) or aluminum (Al) onto the transparent quartz substrate 126 and has a plurality of openings of the same area. This allows the light-shielding mask 123 to determine the shapes of the images to be projected onto the substrate 2 shown in FIG. 2 through irradiation of the laser light L.

Specifically, as shown in FIG. 4, the light-shielding mask 123 has openings of the same area arranged in straight lines extending in the direction (Y direction) orthogonal to the transport direction (indicated by arrow A1) of the substrate 2 at the same arrangement pitch $w_1$ as the gate electrodes 3, for example.

In the light-shielding mask 123, openings 128a to 128e of the same area are arranged side by side in the direction (X direction) parallel to the transport direction of the substrate 2 at the same arrangement pitch $w_2$ as the gate electrodes 3. Each of the mask patterns of the openings 128a to 128e is a combination of a first pattern and a second pattern which are used for irradiating the substrate 2 on which the gate electrode 3, the insulating film 4, and the amorphous silicon film 8 are sequentially stacked. Specifically, through the first pattern, the formation region of the channel region 52 in the amorphous silicon film 8 is irradiated with the laser light L. Through the second pattern, the storage region, which stores heat generated by irradiation of the laser light L, in the amorphous silicon film is irradiated with the laser light L. The areas to be irradiated through the mask patterns of the openings 128a to 128e, each of which has the first and second patterns, will be described later with reference to FIGS. 6 to 8.

Assume here that laser annealing is performed with n shots of the laser light L, where n is a positive integer. Then, e.g., when n=5, five rows of the openings are arranged side by side at the arrangement pitch $w_2$ in the transport direction. For example, the set of the openings 128a surrounded by dashed-dotted line in FIG. 4 constitutes one row (referred to as "opening row 129"). Similarly, each of the set of the openings 128b, the set of the openings 128c, the set of the openings 128d, and the set of the openings 128e constitutes one row. Among these opening rows, the opening row 129 is positioned furthest upstream in the transport direction.

The microlens array 124, which includes the plurality of microlenses 125, allows projecting and focusing reduced-size images of the opening onto regions corresponding to the gate electrodes 3.

Referring back to FIG. 3, the alignment means 13, which is a means for ensuring that target positions are appropriately irradiated with the laser light L, moves the light-shielding mask 123 and microlens array 124 so as to follow the movement of the substrate 2 when, for example, the substrate 2 swings from side to side with respect to the transport direction while the substrate 2 is transported.

The image capture means 14 is provided under the transport surface of the transport means 11. Through the substrate 2 from its back side, the image capture means 14 captures an image of the gate electrodes 3 and the gate lines 3a (see FIG. 6) formed on the front surface of the substrate 2. For example, the image capture means 14 is a line camera having an elongated light-receiving surface in which a plurality of light-receiving elements are arranged in a straight line extending in the direction orthogonal to the transport direction. The line camera is used to determine whether or not positions to be irradiated with the laser light L coincide with the target positions.

The control unit 15 performs overall control of the transport means 11, the laser illumination optical system 12, the alignment means 13, and the image capture means 14. The transport means 11, the laser illumination optical system 12, the alignment means 13, the image capture means 14, and the control unit 15 are electrically connected to each other.

Specifically, each time the irradiation target, i.e., the to-be-irradiated object in which the gate electrode 3, the insulating film 4, and the amorphous silicon film 8 are sequentially stacked, is irradiated with the laser light L, the control unit 15 moves the irradiation target to the position right under the adjacent opening in the direction from the position right under the opening 128a to the position right under the opening 128e in the light-shielding mask 123. In other words, the control unit 15 controls the stepwise movement distance of the substrate 2 such that the substrate 2 moves a distance d (arrangement pitch $w_2$) at a time. This allows the areas including the channel regions 52 to be irradiated with the laser light L each time the areas move stepwise.

Then, the control unit 15 analyzes image information received from the line camera, and determines whether or not positions to be irradiated with the laser light L coincide with the target positions based on the degree of coincidence between the centerline of the opening row to be irradiated in the light-shielding mask 123 and the longitudinal centerline of the light-receiving surface of the line camera. When the control unit 15 determines that the to-be-irradiated positions coincide with the target positions, the control unit 15 outputs, to the laser 121, a command to emit one pulse (one shot) of the laser light L, and the laser 121 emits the laser light L in response. When the control unit 15 determines that the to-be-irradiated positions do not coincide with the target positions, the control unit 15 outputs, to the alignment means 13, a command to move the substrate 2 such that the to-be-irradiated positions coincide with the target positions, and then causes these to-be-irradiated positions to be laser irradiated.

Next, with reference to FIGS. 6 to 9, how the laser annealing step is performed by the laser annealing apparatus 100 will be specifically described. In the laser annealing step, the predetermined areas each including the formation region of the channel region 52 are irradiated with laser light each time the substrate 2 is moved stepwise. More specifically, when each row of these predetermined areas are irradiated with five shots of the laser light L in the laser annealing step, the stepwise movement distance of the positions to be irradiated with the laser light L is set to be equal to the distance d (arrangement pitch $w_2$).

FIG. 6 is a plan view for illustrating an example laser annealing step according to the present invention. First, the control unit 15 shown in FIG. 3 moves the substrate 2 in the direction indicated by arrow A1 and stops the substrate 2 at a position that provides accurate positioning of the positions that are to be first irradiated.

Next, as shown in FIG. 6, the control unit 15 causes areas, corresponding to the gate electrodes 3, of the uppermost amorphous silicon film 8 to be irradiated with one shot of the laser light L that is shaped by the openings 128a such that each image projected onto the amorphous silicon film 8 through irradiation of the laser light L has a shape of pattern P (first round of irradiation). In this event, as an example of irradiation conditions of laser light L, it is preferable to set the power of the laser light L to a previously calculated value corresponding to the peak value of the electron mobility. Thereby, by performing the processing described below in the laser annealing step, the electron mobility can be further improved without damaging the amorphous silicon film 8.

Figure 7:
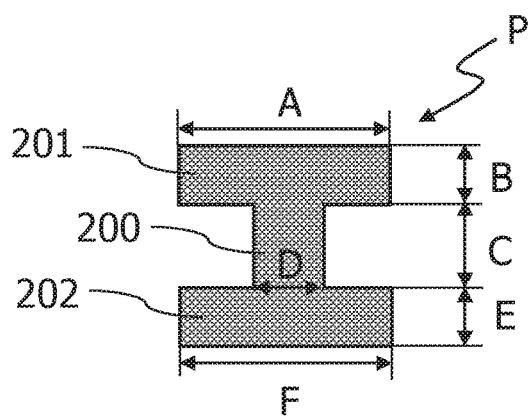
FIG. 7 is a plan view for illustrating an example area to be irradiated with laser light in FIG. 6.

FIG. 7 is a plan view for illustrating an example area to be irradiated with laser light in FIG. 6. Each of the areas (pattern P) to be irradiated so as to correspond to the reduced-size images of the mask patterns includes a pattern 201 (area with dimensions A and B) and a pattern 202 (area with dimensions E and F) which correspond to the first pattern, and a pattern 200 (area with dimensions C and D) which corresponds to the second pattern. Here, the length of the dimension D is, for example, 4 µm. Note that the patterns 201, 202 are examples of the storage region, and the pattern 200 is an example of the formation region of the channel region 52.

In the light-shielding mask 123, each of the mask patterns of the openings 128a to 128e, which is formed of the combination of the first and second patterns, allows a corresponding area having the following characteristics to be irradiated with the laser light L. That is, the corresponding area extends within a region (laser-irradiatable region) that is defined by the size of the gate electrode 3 in the amorphous silicon film 8, but not extending to regions that are adjacent to the pattern 200 (formation region) and that are to be located under the source and drain electrodes 6, 7. In other words, the reason why the areas to be irradiated are shaped as shown in FIG. 7 is that it is preferable not to irradiate the source and drain regions 51, 53 shown in FIG. 2 with the laser light L in order to ensure that amorphous silicon in the source and drain regions 51, 53 are not turned into polysilicon. Shaping the to-be-irradiated areas as shown in FIG. 7 allows preventing or reducing a leakage current from the source and drain regions 51, 53.

Figure 8:
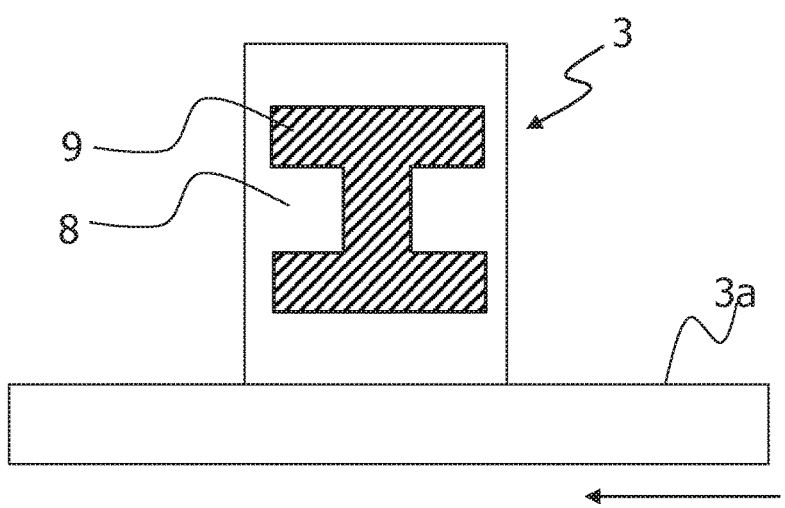
FIG. 8 is a plan view for illustrating an example of the laser annealing step according to the present invention.

FIG. 8 is a plan view for illustrating an example of the laser annealing step according to the present invention. FIGS. 9A to 9E illustrate the procedure of the laser annealing step according to the present invention. FIGS. 9A to 9E are time-series diagrams schematically showing how the amorphous silicon film 8 is irradiated with five laser shots. In this laser annealing step, the amorphous silicon film 8 is irradiated with multiple shots (multiple irradiations) of the pulsed laser light L so as to be formed into the polysilicon film 9 including the channel region 52.

FIG. 8 shows an example result obtained by irradiating the area of the pattern P shown in FIG. 6 with the laser light L. In this example, the irradiated portion of the amorphous silicon film 8 is instantaneously heated and melted so that the binding states of the silicon molecules therein are changed from the amorphous states (non-crystalline states) to the poly-states (polycrystalline states), which results in progress toward the formation of the channel region 52 (see FIG. 9A). In this event, the storage regions, i.e., the regions of the patterns 201, 202, are irradiated with the laser light L so that amorphous silicon therein is turned into polysilicon after the laser annealing step. In the first embodiment, additionally irradiating the storage regions with the laser light L increases an area size (surface area size) irradiated with the laser light L and provides an additional heat capacity corresponding to the additional irradiated area size, as compared to when only the formation region is irradiated with the laser light L. This helps maintain the temperature of the formation region of the channel region 52 after laser irradiation and promotes the recrystallization of the channel region 52 accordingly.

Next, the control unit 15 moves the substrate 2 by the distance d as a stepwise movement in the direction indicated by arrow A1 shown in FIG. 3, and performs a second round of irradiation with one shot of the laser light L that is shaped by the openings 128b in the same manner as described above (see FIG. 9B).

As a result, the irradiation dose in each overlapping portion of the area irradiated with the first shot of laser light L and the area irradiated with the second shot of laser light L has increased as compared to when it is irradiated only with the first shot of laser light L. Thus, the recrystallization (crystal growth) in such overlapping portions is promoted after this second round of irradiation. In addition, the recrystallization of the channel regions 52 is further promoted by the heat storage effect provided by the regions of the patterns 201, 202 as described above.

Figure 9A:
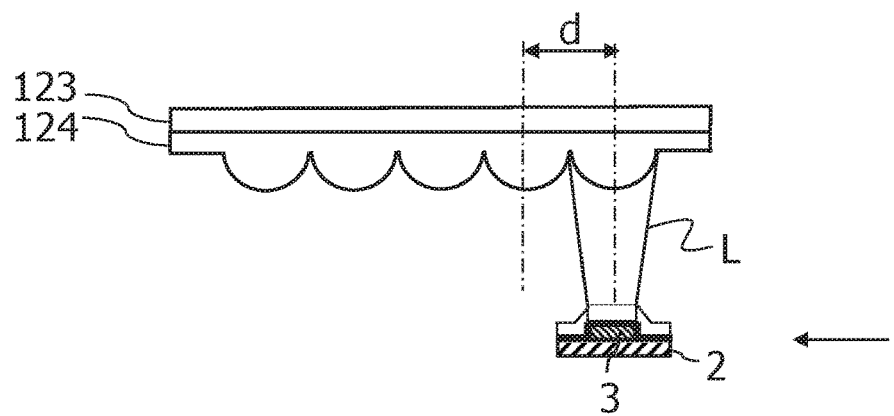
FIGS. 9A to 9E illustrate the procedure of the laser annealing step according to the present invention.
Figure 9B:
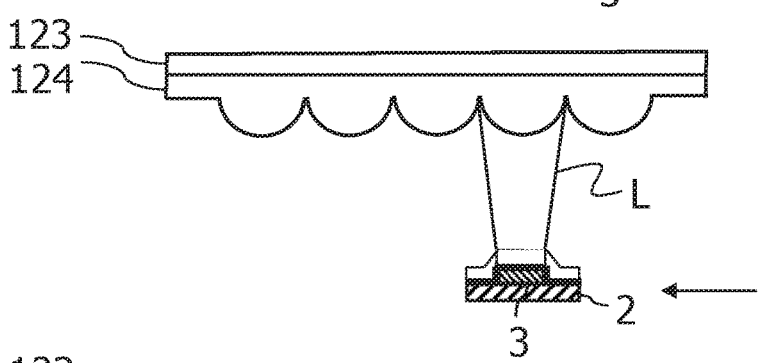
Figure 9C:
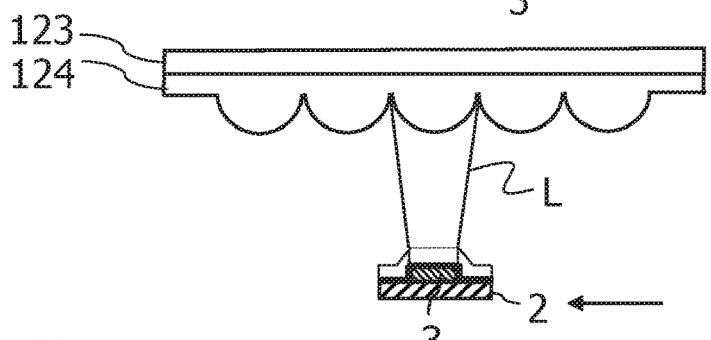
Figure 9D:
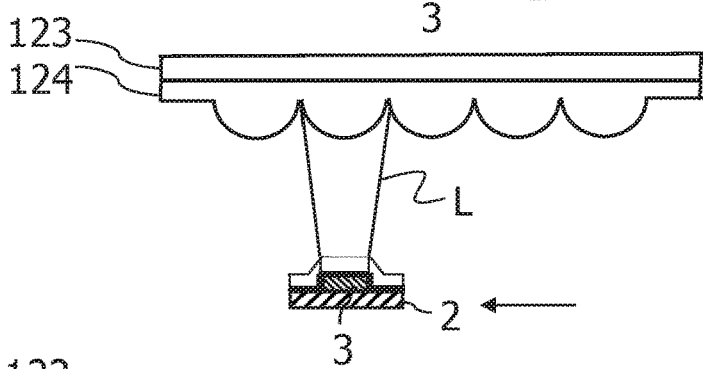
Figure 9E:
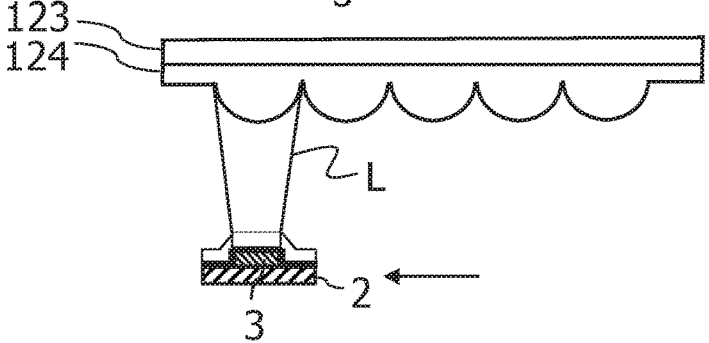

After that, the control unit 15 repeatedly moves the substrate 2 by the distance d as a stepwise movement, and causes the to-be-irradiated areas to undergo laser irradiation each time the substrate 2 is moved stepwise, until the laser annealing step is completed when each of the gate electrodes 3 of the substrates 2 is irradiated with five laser shots (see FIGS. 9C to 9E). Thus, in the laser annealing step, the amorphous silicon film 8 is irradiated with multiple shots of the laser light L and thereby finally formed into the polysilicon film 9 including the channel regions 52.

In this way, heat is stored in the storage regions (patterns 201, 202) upon each shot of the laser light L, and the heat stored through five shots of the laser light L promotes recrystallization in accordance with the additional heat capacity provided by the stored heat (the amount of the stored heat). As a result, the polysilicon film 9 including the channel regions 52 of satisfactory quality can be formed.

Figure 10:
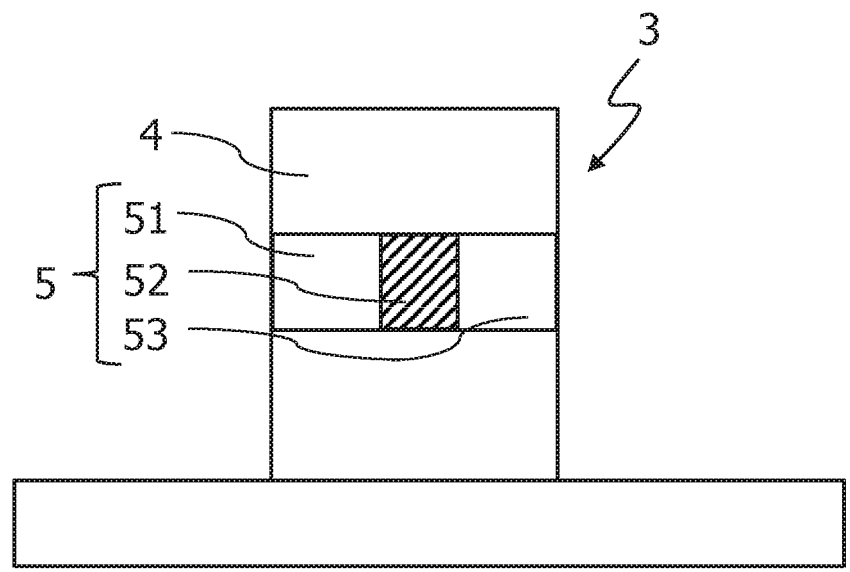
FIG. 10 is a plan view for illustrating an example of the removing step according to the present invention.

Next, the step of removing the storage regions according to the present invention (step S3) is performed. FIG. 10 is a plan view for illustrating an example of the removing step according to the present invention. After the completion of the laser annealing step, the regions of the patterns 201, 202 (storage regions) in which amorphous silicon has been turned into polysilicon are etched off. As a result, the semiconductor layer 5 (the source region 51, channel region 52, and drain region 53) is formed on the insulating film 4. In other words, at the completion of the laser annealing step, amorphous silicon in the storage regions on the substrate 2 has been turned into polysilicon, and the storage regions have completed the role of promoting the recrystallization of the channel regions 52. Thus, the removing step is characterized by etching off areas outside the channel regions 52 from the areas in which amorphous silicon has been turned into polysilicon. As a result, polysilicon is satisfactorily formed only in the channel regions 52 in the first embodiment.

Figure 11:
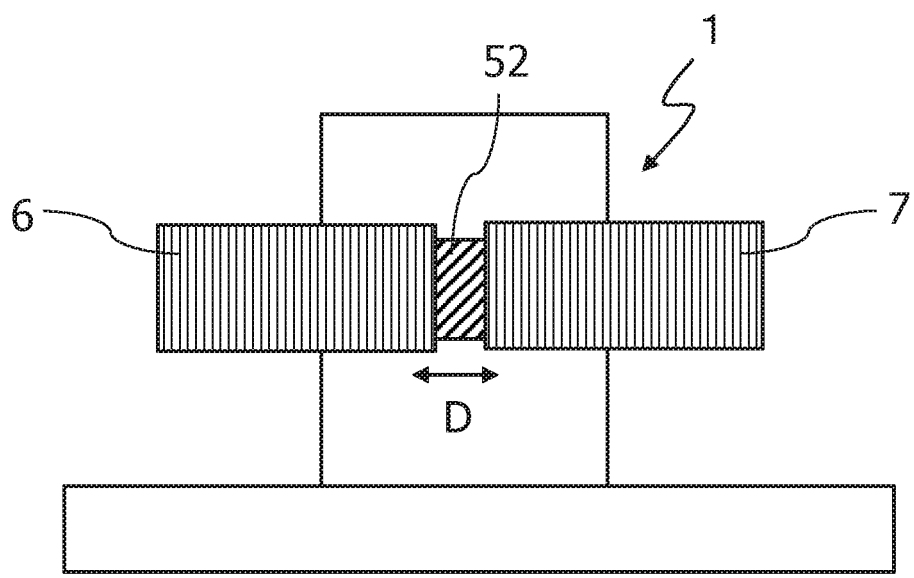
FIG. 11 is a plan view of an example TFT obtained by stacking source and drain electrodes on the resultant product of the removing step.

Next, the plurality of steps up to the completion of manufacturing a TFT (step S4) are performed. FIG. 11 is a plan view of an example TFT obtained by stacking source and drain electrodes on the resultant product of the removing step. In FIG. 11, the source electrode 6 is stacked so as to cover the source region 51 shown in FIG. 10 and the drain electrode 7 is stacked so as to cover the drain region 53 shown in FIG. 10. Specifically, the source and drain electrodes 6, 7 are stacked so as to partially cover the channel region 52. In FIG. 11, width D represents the width of the channel region 52. In the first embodiment, the TFT 1 can be finally manufactured by appropriately using a known technique.

Next, a second embodiment will be described. Note that the same reference numerals are given to the same constituent elements as those of the first embodiment, and the description therefor will be omitted. Below, the differences from the first embodiment will be mainly described in detail.

Figure 12:
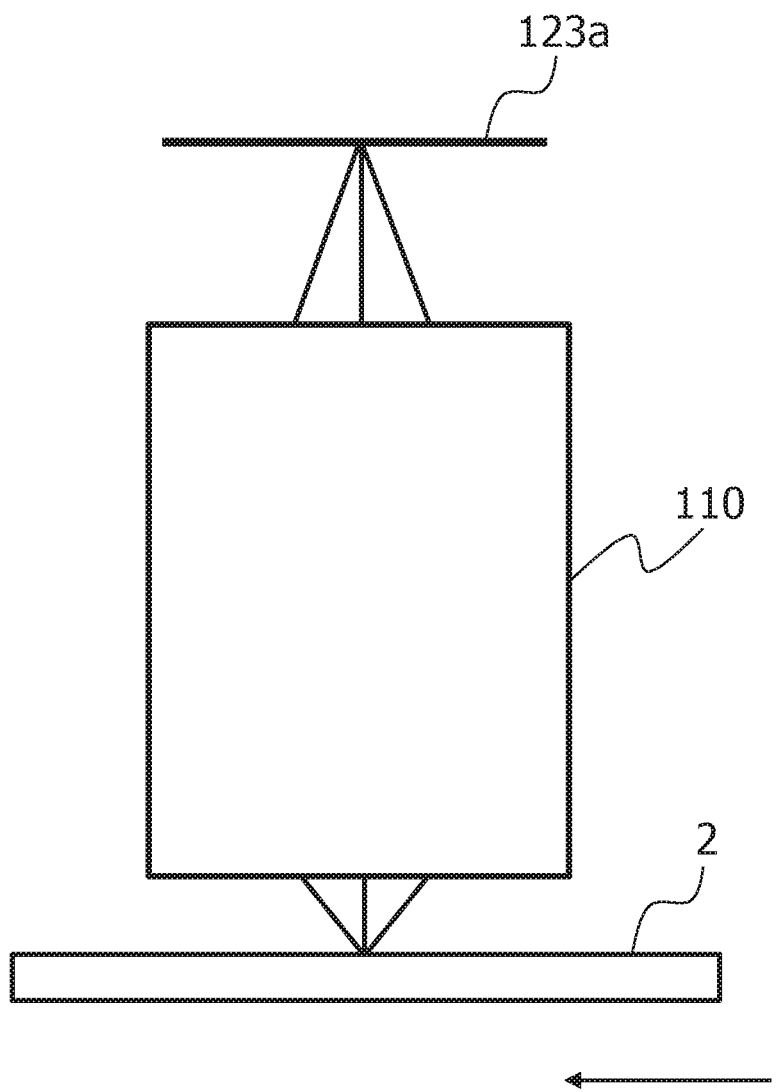
FIG. 12 is an enlarged front view of a substantial part of a modification of the laser annealing apparatus shown in FIG. 3.

FIG. 12 is an enlarged front view of a substantial part of a modification of the laser annealing apparatus shown in FIG. 3. As described above, in the first embodiment, the reduced-size images of the mask patterns of the plurality of openings 128a to 128e formed in the light-shielding mask 123 are projected onto the substrate 2 through the microlenses 125 provided individually corresponding to the plurality of openings 128a to 128e. In contrast, in the second embodiment, the reduced-size images of the plurality of openings 128a to 128e of the light-shielding mask 123a are projected onto the substrate 2 through a single projection lens (project optical system) 110. Accordingly, in the second embodiment, the configuration of the light-shielding mask 123 and microlens array 124 shown in FIG. 3 is replaced with the system shown in FIG. 12.

Figure 13:
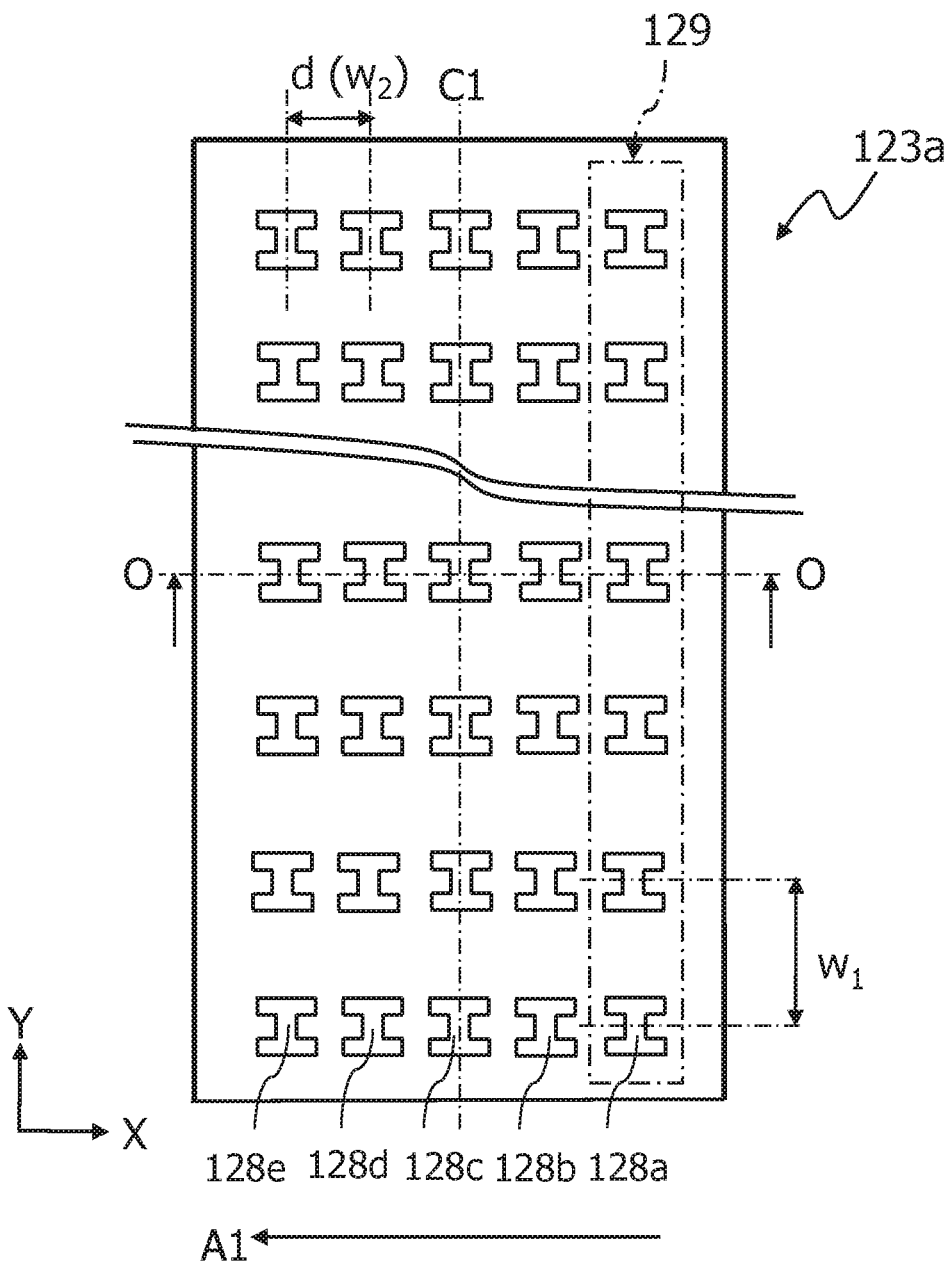
FIG. 13 is a plan view of an example configuration of the light-shielding mask used in the method for manufacturing a TFT according to the present invention.
Figure 14:
FIG. 14 is a cross-sectional view taken along line O-O of FIG. 13.

FIG. 13 is a plan view of an example configuration of the light-shielding mask used in the method for manufacturing a TFT according to the present invention. FIG. 14 is a cross-sectional view taken along line O-O of FIG. 13. A light-shielding mask 123a shown in FIG. 13 differs from the light-shielding mask 123 shown in FIG. 4 only in that the microlenses 125 provided individually corresponding to the openings 128a to 128e are omitted.

Referring back to FIG. 12, the projection lens 110 may be configured to form an inverted or erect image of the light-shielding mask 123a on the substrate 2. When the projection lens 110 is configured to form an inverted image, annealing may be performed using a light shielding mask having the mask patterns that are arranged in 180° rotational symmetry about the center of the light shielding mask with respect to mask pattern images to be projected. Here, a mask having bilaterally symmetrical patterns with respect to the center axis C1 like the light-shielding mask 123a shown in FIG. 13 is advantageous since it may be used together with the projection lens 110 configured to form either an erect or inverted image. In light of this, the case using the projection lens 110 configured to form an erect image will be described below.

When the projection lens 110 is configured to form an erect image, the mask patterns of the plurality of openings 128a to 128e in the light-shielding mask 123a shown in FIG. 13 are the same as the mask patterns of the plurality of openings 128a to 128e in the light-shielding mask 123 shown in FIG. 4. In this case, the arrangement pitches ($w_1$, $w_2$) of the openings 128a to 128e are set to values obtained by converting the longitudinal and lateral arrangement pitches of the gate electrodes 3, i.e., the formation regions of the TFTs 1, based on the magnification of the projection lens 110.

Furthermore, the irradiation of the pulsed laser light L starts when the irradiation-target gate electrodes 3 that are positioned furthest downstream in the substrate transport direction arrive at the focal positions of the opening row 129 (see FIG. 13) that is positioned furthest upstream in the substrate transport direction among the opening rows of the openings 128a to 128e that are lined up in the direction orthogonal to the substrate transport direction. The subsequent irradiation timings of the laser light L are the same as those in the first embodiment.

As described above, in the method for manufacturing a TFT according to the present invention, the areas including the formation regions of the channel regions 52 (patterns P) are irradiated with the laser light L using the light-shielding mask 123 or 123a in the laser annealing step. Thus, even when the irradiation of the laser light L has to be performed under restricted irradiation conditions, relatively large amounts of heat can be stored when the amorphous silicon film is heated and melted, and an additional heat capacity can be provided corresponding to the additional irradiated area size. This promotes the recrystallization of the channel regions and further improves the electron mobility in the channel regions.

Furthermore, the method for manufacturing a TFT according to the present invention allows thermal energy for promoting the recrystallization of the channel region 52 of the TFT 1 to be stored in regions surrounding the channel region 52. This allows for promoting the recrystallization with limited energy of laser and allows for extensive application of the laser annealing.

If only the formation region of the channel region 52 is locally irradiated with the laser light L having energy high enough to provide the above effects, the amorphous silicon film 8 may be damaged. In contrast, in the method for manufacturing a TFT according to the present invention, the formation region of the channel region 52 and the storage region are irradiated with the laser light L so that heat can be stored in the regions surrounding the formation region in addition to the formation region. Thus, damage to the amorphous silicon film 8 may be prevented.

In the above embodiments (first and second embodiments), laser irradiation is performed through five laser shots, as an example. If, for example, only the formation region of the channel region 52 is irradiated with laser so as to provide the same effects as those provided by such an increased number of laser shots, an accordingly increased processing time (takt time) is required for the apparatus for manufacturing TFTs. Since the above embodiments allow for a shorter processing time, the method for manufacturing a TFT described above is advantageous also in this regard.

Conventionally, the irradiation conditions of laser light have depended greatly on the laser power and the number of laser shots, for example. In contrast, by adopting the above embodiments, electron mobility can be improved by the combined effect of controlling the laser power, the number of laser shots, and the irradiation area size. Thus, the above embodiments allow laser irradiation to be performed under greater variation of irradiation conditions.

The above embodiments described above illustrate preferred examples of the present invention. The structures and arrangement of the constituent elements and the order of the steps illustrated in the above embodiments are merely examples, and are not intended to limit the present invention. For example, the structure of the TFT 1, the shape of the light-shielding mask 123, and the arrangement of the mask patterns are merely illustrative examples. Alternatively, the light-shielding mask 123 and microlens array 124 may be integrated as a mask according to the present invention. Still alternatively, for example, the removing step S3 may be performed after a different step is performed after step S2 shown in FIG. 1.

In the above embodiments, the substrate 2 is laser annealed while the substrate 2 is transported, but the present invention is not limited to this. Alternatively, the substrate 2 placed to be stationary may be laser annealed with a single shot or multiple shots of laser irradiation.

To facilitate understanding of the invention, the constituent elements are not necessarily shown to scale in the drawings referred to in the above embodiments. It should be understood that the present invention is not limited by the description of the above embodiments, and the above embodiments may be modified as needed without departing from the spirit of the present invention. For example, although a pulsed laser light is used in the above embodiments, the above embodiments may be appropriately modified so as to provide the advantageous effects of the present invention using a continuous wave (CW) laser, which outputs a continuous laser light. Furthermore, although the present invention is applied to a bottom-gate (inverted-staggered) TFT in the above embodiments, the present invention may also be applied to a top-gate (staggered) TFT.

It should be noted that the entire contents of Japanese Patent Application No. 2016-052087, filed on Mar. 16, 2016, based on which convention priority is claimed herein, is incorporated herein by reference.

It should also be understood that many modifications and variations of the described embodiment of the invention will be apparent to a person having an ordinary skill in the art without departing from the spirit and scope of the present invention as claimed in the appended claims.

What is claimed is:

1. A mask having mask patterns arranged in a matrix at a constant arrangement pitch, the mask being used for projecting reduced-size images of the mask patterns through a projection lens and thereby irradiating areas corresponding to the mask patterns with laser light, wherein each of the mask patterns is a combination of a first pattern and a second pattern which are used for irradiating a to-be-irradiated object in which a gate electrode, an insulating film, and an amorphous silicon film are sequentially stacked, wherein, through the first pattern, a formation region of a channel region in the amorphous silicon film is irradiated with the laser light, wherein, through the second pattern, a storage region in the amorphous silicon film is irradiated with the laser light, the storage region storing heat generated by irradiation of the laser light, and wherein each of the mask patterns has an opening that allows a corresponding area to be irradiated with the laser light, the corresponding area extending within an irradiatable region that is defined by a size of the gate electrode in the amorphous silicon film, but not extending to regions that are adjacent to the formation region of the channel region and that are to be located under source and drain electrodes.

2. A mask having mask patterns arranged in a matrix at a constant arrangement pitch, the mask being used for projecting reduced-size images of the mask patterns through a projection lens and thereby irradiating areas corresponding to the mask patterns with laser light, wherein each of the mask patterns is a combination of a first pattern and a second pattern which are used for irradiating a to-be-irradiated object in which a gate electrode, an insulating film, and an amorphous silicon film are sequentially stacked, wherein, through the first pattern, a formation region of a channel region in the amorphous silicon film is irradiated with the laser light, wherein, through the second pattern, a storage region in the amorphous silicon film is irradiated with the laser light, the storage region storing heat generated by irradiation of the laser light, wherein the projection lens includes a plurality of microlenses, and wherein each of the mask patterns has an opening that allows a corresponding area to be irradiated with the laser light, the corresponding area extending within an irradiatable region that is defined by a size of the gate electrode in the amorphous silicon film, but not extending to regions that are adjacent to the formation region of the channel region and that are to be located under source and drain electrodes.

* * * * *